United States Patent [19]
Delmas

[11] Patent Number: 5,835,040
[45] Date of Patent: Nov. 10, 1998

[54] DIGITAL PROCESSING CIRCUIT WITH GAIN CONTROL

[75] Inventor: Christian Delmas, Saint-Egreve, France

[73] Assignee: Thomson Multimedia S.A., Cedex, France

[21] Appl. No.: 770,094

[22] Filed: Dec. 19, 1996

[30] Foreign Application Priority Data

Dec. 29, 1995 [FR] France .................................. 95 15745

[51] Int. Cl.[6] .................................................. H03M 1/18
[52] U.S. Cl. ........................................... 341/139; 341/110
[58] Field of Search .................................... 341/110, 139

[56] References Cited

U.S. PATENT DOCUMENTS 4,910,515   3/1990   Iwamatsu .................................. 341/110

FOREIGN PATENT DOCUMENTS 4-096516   3/1992   Japan ...................................... 341/139
6-260936   9/1994   Japan ...................................... 341/110

OTHER PUBLICATIONS

Analog Devices *Analog–Digital Conversion Handbook*, copyright 1986, pp. 202, 203, 609–614.

*Primary Examiner*—Howard L. Williams
*Attorney, Agent, or Firm*—Joseph S. Tripoli; Eric P. Herrmann

[57] ABSTRACT

The invention relates to a digital processing circuit comprising an analog/digital converter (1) situated at the input of the circuit, a device (2) for the digital processing of the signal emanating from the analog/digital converter and a digital/analog converter (3) situated at the output of the processing circuit. The digital processing circuit comprises means (A2, A3, T, RS, R1) making it possible to control its gain from a single voltage reference (VB). Preferably, the single voltage reference is a bandgap voltage and the circuit is made in CMOS technology. The invention applies to any type of audio or video equipment using such circuits.

15 Claims, 2 Drawing Sheets

DIGITAL PROCESSING CIRCUIT WITH GAIN CONTROL

The invention relates to a digital processing circuit whose input consists of an analogue/digital converter and whose output consists of a digital/analogue converter.

More particularly, the invention relates to a circuit making it possible to control the gain of a digital processing circuit such as that mentioned above.

The invention applies to any type of audio or video equipment using such circuits such as, for example, television receivers, video recorders or satellite decoders, etc.

The processing circuits according to the invention therefore consist of three elementary circuits: an analogue/digital converter, a digital processing device, and a digital/analogue converter.

Two types of configuration are currently known by those skilled in the art in order to make these processing circuits.

A first configuration consists in making the three elementary circuits separately and in assembling them to constitute the processing circuit. According to this first configuration, each analogue/digital and digital/analogue converter has its gain controlled by a reference which is specific to it. This involves a control circuit which may or may not be integrated with the elementary circuit which is constituted by the converter.

Generally, the reference which makes it possible to control the gain is produced by a specific circuit from the supply voltage of the converter.

Depending on the accuracy required in the gain control, it is then necessary to make more or less complex and bulky specific circuits.

Another way of producing the gain control is to use a voltage reference internal to the component constituted by the converter. This internal voltage reference is known to those skilled in the art as a bandgap voltage. However, according to certain technologies such as, for example, CMOS technology, bandgap voltages are difficult to reproduce from one component to another. The difference between two bandgap voltages produced for two different components may in fact reach, or even exceed, a value of 10%. This results in a large spread in the gains relating to various circuits.

A second configuration consists in making the three elementary circuits with the aid of two components: the analogue/digital converter constitutes a first component and the assembly constituted by the digital processing device and the digital/analogue converter constitutes a second component.

The control of gain of the processing circuit is then effected by gain control in relation to each of the two components.

The reference which allows the control of gain of each component is produced as mentioned above, that is to say either with the aid of specific circuits having good accuracy but which are relatively complex and bulky, or with the aid of bandgap voltages which are difficult to reproduce.

The invention does not have these drawbacks.

The present invention proposes a digital processing circuit comprising an analogue/digital converter situated at the input of the circuit, a device for the digital processing of the signal emanating from the analogue/digital converter and a digital/analogue converter situated at the output of the circuit and making it possible to convert the signal emanating from the digital processing device. The digital processing circuit comprises means making it possible to control its gain from a single voltage reference.

Advantageously, the means mentioned above are such that the gain of the processing circuit according to the invention is independent of the single voltage reference.

Preferably, the single voltage reference is a bandgap voltage and the circuit is made in CMOS technology.

More generally, the circuit according to the invention can however be made with the aid of other technologies.

Other characteristics and advantages of the invention will emerge on reading a preferred embodiment taken by way of non-limiting example and given with reference to the appended figures in which.

In all the figures, the same labels denote the same elements.

Figure 1:
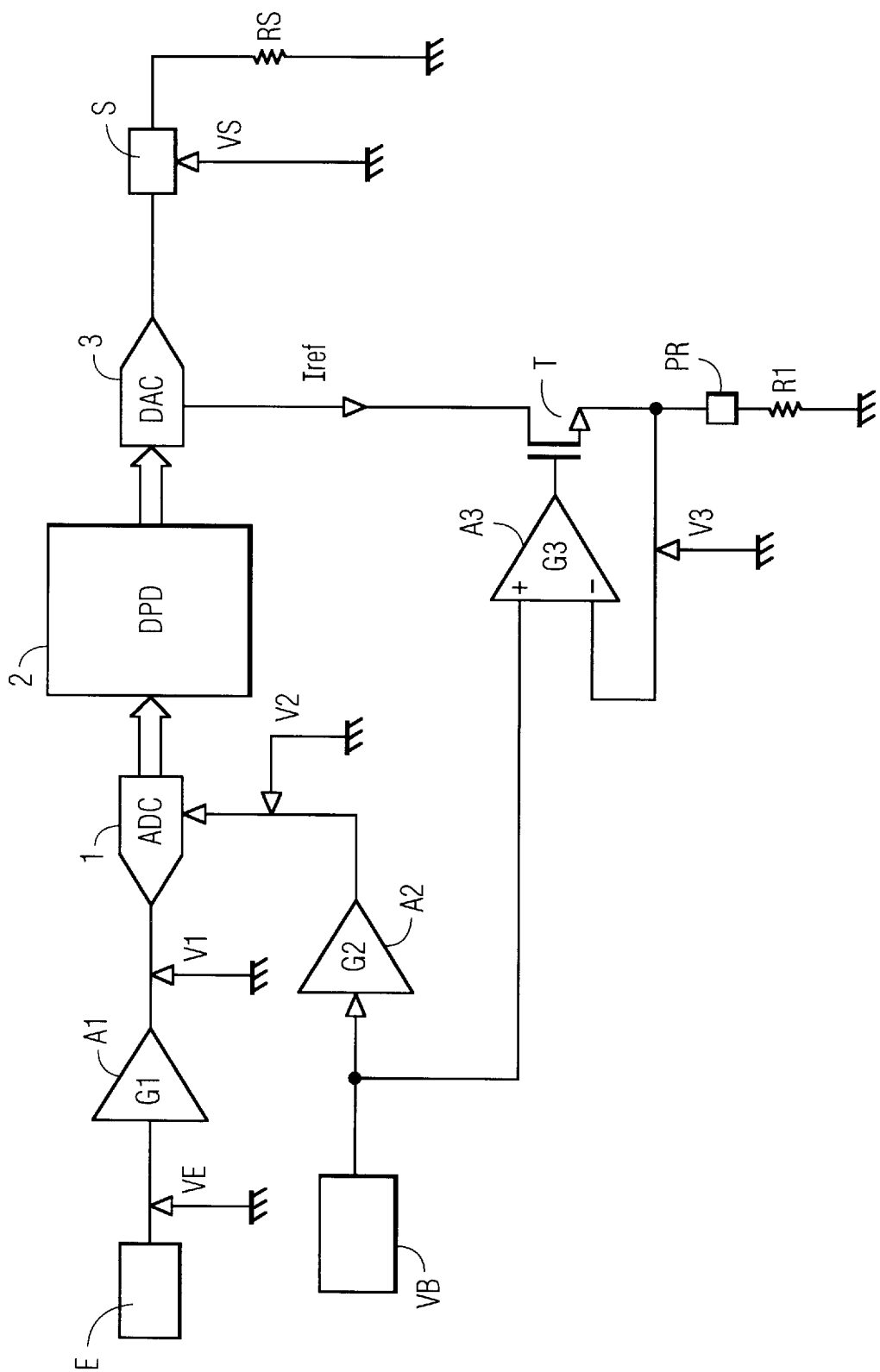
FIG. 1 represents a first example of the embodiment of the invention.

The processing circuit consists of an analogue/digital converter 1, a digital processing device 2, and a digital/analogue converter 3. According to the embodiment of FIG. 1, the digital/analogue converter 3 is current-controlled so as to facilitate the switching operations. Advantageously, a single voltage reference VB is used to deliver both the reference voltage V2 for the analogue/digital converter and the reference current Iref for the digital/analogue converter.

The reference voltage V2 emanates from the amplifier A2 of gain G2 which on its input receives the voltage VB. It therefore follows that:

$$V2 = G2 \times VB.$$

The voltage VB is sent to the positive input of the differential amplifier A3 whose negative input is connected, on the one hand, to the earth of the circuit by way of the resistor R1 and, on the other hand, to the source of a transistor T. The gate and the drain of the transistor T are respectively connected to the output of the differential amplifier A3 and to the point of the digital/analogue converter from which the reference current Iref is extracted. The differential amplifier of very high gain G3 is such that V+=V- where V+ and V- are respectively the voltage applied to the positive input and the voltage applied to the negative input of the differential amplifier A3.

It follows that the voltage V3 gathered at the terminals of the resistor R1 is equal to the voltage VB. The reference current Iref is then such that:

$$Iref = \frac{VB}{R1}.$$

As known to those skilled in the art, the output current IS which passes through the resistor RS which loads the output of the digital/analogue converter 3 can be written:

$$IS = Im \times \frac{N}{2^n - 1},$$

where:

Im=k×Iref, Im representing the maximum current available at the output of the processing device, k being a coefficient associated with the structure of the digital/analogue converter, N represents the place value of the binary code converted, that is to say an integer lying between 0 and $2^n-1$ for an n-bit converter, $2^n-1$ represents the maximum place value which the converted binary code can take.

The voltage VS gathered on the output S of the processing circuit can then be written:

$$VS = RS \times k \times Iref \times \frac{N}{2^n - 1}.$$

Now, $$Iref = \frac{VB}{R1},$$

it therefore follows that:

$$VS = RS \times k \times \frac{VB}{R1} \times \frac{N}{2^n - 1}.$$

Preferably, on its input the processing circuit comprises an amplifier A1 of gain G1. It follows that the voltage V1 at the input of the analogue/digital converter 1 is such that:

$$V1 = G1 \times VE,$$

where VE is the voltage applied to the input E of the processing circuit.

As known to those skilled in the art, the voltage V1 at the input of the converter 1 can be written:

$$V1 = N \times \Delta V,$$

where N is the place value of the binary code as mentioned earlier and $\Delta V$ the elementary step of the analogue voltage to be converted.

It therefore follows that:

$$VE = \frac{N \times \Delta V}{G1},$$

now $$\Delta V = \frac{V2}{2^n - 1}$$

and $V2 = G2 \times VB$.

It follows that $$VE = \frac{N \times G2 \times VB}{G1 \times 2^n - 1}.$$

The gain of the processing circuit can therefore be written:

$$G = \frac{VS}{VE},$$

or:

$$G = \frac{RS}{R1} \times \frac{G1}{G2} \times k.$$

As emerges from the formula giving the gain G, the value of G does not depend on the value of the reference voltage VB.

Advantageously, the value of the gain of the processing circuits according to the invention is not affected by the difficulty which there may be in reproducing the value of the voltage VB.

According to the preferred embodiment, the various elements constituted by the amplifiers A1, A2, A3, the transistor T, the converters 1 and 3 and the digital processing device 2 are integrated within one and the same component made in CMOS technology. As mentioned earlier, the reference voltage VB is then a bandgap voltage internal to the component and the variations of which may reach, or even exceed, 10% from one component to another.

Advantageously, the gain values associated with various processing circuits made in CMOS technology are then not affected by the variations in the bandgap voltage.

According to the invention, the resistors R1 and RS may or may not be integrated with the component constituted by the processing circuit.

In the case in which the resistors R1 and RS are not integrated with the component, the value of the gain of the processing circuit is adjustable by modifying the value of the resistors. Advantageously, adjustment of the value of the gain according to the invention is then simplified with respect to the adjustment to be employed with the prior art circuits.

The accuracy in the value of the gain G depends on the accuracy of the resistors RS and R1, the gains G1 and G2 and the coefficient k. Generally, the values of the gains G1 and G2 and of the coefficient k are easily reproduced. It follows that the accuracy in the value of the gain G usually depends only on the accuracy of the resistors RS and R1. Thus, the user can choose, for example, resistors at 5% for applications which do not require high accuracy or, on the contrary, resistors at 0.1% for applications which do require high accuracy. In the latter case, that is to say the case in which the resistors are of high accuracy, the gains obtained for various processing circuits have values which can be reproduced within a bracket of less than or equal to 2%.

According to a particular embodiment, the processing circuit does not contain amplifiers A1 and A2. It follows that gains G1 and G2 which appear in the expression for G are both equal to 1. This application corresponds to a coding dynamic range equal to the reference voltage since then V2 is equal to VB. The gain of the processing circuit then depends exclusively only on the resistors RS and R1 and on the factor k. The variation of gain G from one circuit to another can then be rendered very small.

Figure 2:
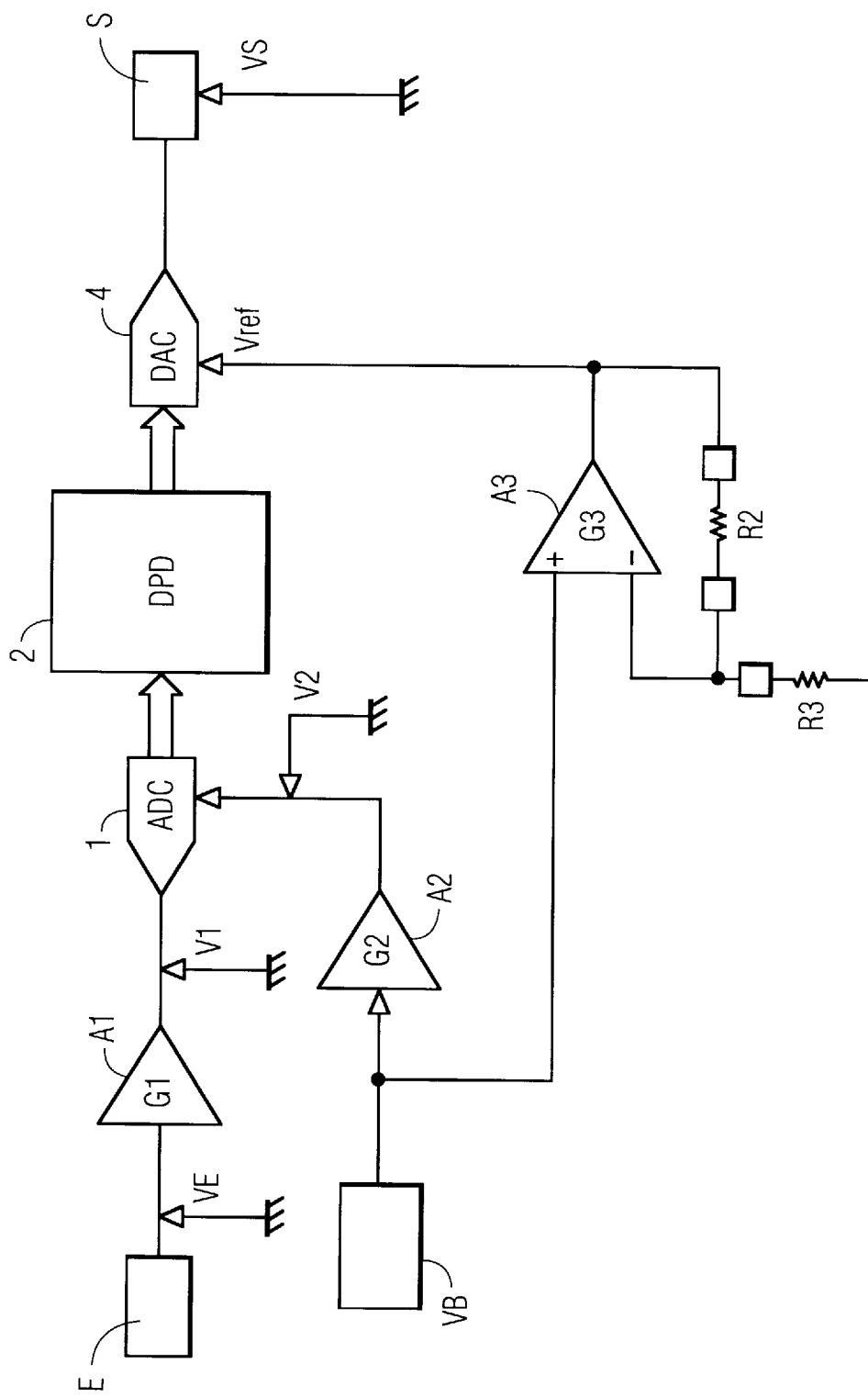
FIG. 2 represents a second example of the embodiment of the invention.

FIG. 2 represents a second example of the embodiment of the invention.

According to this second embodiment, the output digital/analogue converter 4 is controlled by a reference voltage Vref. The reference voltage Vref is obtained from the voltage VB.

For this purpose, the voltage VB is sent to the positive input of the differential amplifier A3 whose negative input is connected, on the one hand, to the earth of the circuit by way of a resistor R3 and, on the other hand, to the output of the amplifier A3 by way of a resistor R2.

The reference voltage Vref is the voltage obtained at the output of the amplifier A3.

It then follows that:

$$Vref = G_0 \times VB,$$

where $G_0$ is equal to $$1 + \frac{R2}{R3}.$$

The output voltage VS of the digital/analogue converter is given by the expression:

$$VS = \frac{N}{2^n - 1} \times Vref.$$

In regard to the input analogue/digital converter, the circuit described in FIG. 2 is identical to the circuit described in FIG. 1. It follows that the expression for the input voltage VE can also be written:

$$VE = \frac{N \times G2 \times VB}{G1 \times 2^n - 1}.$$

Consequently, the expression for the gain G which is the ratio of the voltage VS to the voltage VE can be written:

$$G = \frac{G1}{G2} \times G_0.$$

As in the case of FIG. 1, the various elements, namely the amplifiers A1, A2, A3, the converters 1 and 4 and the digital processing device 2 can be integrated within one and the same component and made with the aid of one and the same technology, for example CMOS technology. Advantageously, the resistors R2 and R3 can either be integrated with the component constituted by the processing circuit, or be elements outside the component.

Advantageously, in the case in which the resistors R2 and R3 are not integrated with the component, the value of the gain of the processing circuit is then adjustable by modifying the value of the resistors.

Irrespective of the embodiment of the processing circuit according to the invention, a particularly interesting application relates to devices for which a signal is applied either to a first pathway wherein digital processing is to be performed, or to a second pathway wherein no digital processing is to be performed. It is then often necessary for the gain of the signal to be substantially the same irrespective of which pathway is followed by the signal.

An exemplary device such as that mentioned above relates to a filter for separating video signal luminance and chrominance components depending on whether the video signal is PAL type or SECAM type. For the PAL type signal, the first pathway is a filtered pathway, that is to say one undergoing analogue/digital conversion, digital processing and digital/analogue conversion. For the SECAM type signal, the second pathway is a pathway which does not undergo the digital processing mentioned above and is commonly referred to as a "bypass" pathway. The gain of the two pathways should be substantially the same.

Advantageously, the invention makes it possible to make such a device.

The embodiments of the invention which are described above relate to a gain control circuit in respect of which the input analogue/digital conversion circuit is voltage-controlled and the output digital/analogue circuit is either voltage-controlled or current-controlled. More generally, the invention relates to a digital processing gain control circuit in respect of which the input analogue/digital converter is either voltage-controlled or current-controlled, as is the output digital/analogue converter.

I claim:

1. Digital processing circuit comprising:
   an analogue/digital converter situated at an input of the processing circuit;
   a device for digital processing of signal emanating from the analogue/digital converter;
   a digital/analogue converter situated at an output of the processing circuit to convert signal emanating from the digital processing device to analog form;
   a source of a reference VB;
   circuitry, responsive to the reference VB, for applying first and second further references to respective reference input connections of said analogue/digital converter and said digital/analogue converter, said first and second further references being different functions of the reference VB and arranged to control the gain of the digital processing circuit.

2. Processing circuit according to claim 1, wherein the gain of the processing circuit is independent of the voltage VB.

3. Processing circuit according to claim 1, wherein said analogue/digital converter, the digital processing device, the digital/analogue converter, and the circuitry responsive to reference voltage VB are made on one and the same component in CMOS technology.

4. Digital processing circuit comprising:
   an analogue/digital converter;
   a device coupled to said analogue/digital converter for digitally processing signal provided by the analogue/digital converter;
   a digital/analogue converter situated at an output of the digital processing circuit for converting signal provided by the digital processing device, the digital/analogue converter being voltage controlled;
   a source of a voltage reference VB;
   means responsive to the voltage reference VB for controlling the gain of the digital processing circuit including,
   a first amplifier of gain G2 coupled to apply a control voltage V2=G2×VB to a reference input of the analogue/digital converter;
   a differential amplifier having a positive input terminal connected to the voltage reference VB and having a negative input terminal connected, on the one hand, to ground potential of the digital processing circuit through a resistor R3 and, on the other hand, to an output of the differential amplifier through a resistor R2, the output of the differential amplifier being connected to a reference input terminal of the digital/analogue converter.

5. Processing circuit according to claim 4, wherein said analogue/digital converter, the digital processing device, the digital/analogue converter, the first amplifier, and the second amplifier are made on one and the same component in CMOS technology.

6. Processing circuit according to claim 5, wherein said resistors R3 and R2 are made in CMOS technology on the said same component.

7. Processing circuit according to claim 5, wherein at least one of the resistors is external to said same component to enable adjustment of the gain of the processing circuit.

8. The processing circuit set forth in claim 4 wherein at least one of said resistors R2 and R3 is external to said digital processing circuit to permit adjustment of said gain of the digital processing circuit.

9. Digital processing circuit comprising:
   a cascade connection of an analogue/digital converter, a digital processing device and a digital/analogue converter, said analogue/digital converter, and digital/analogue converter having respective reference input terminals;
   a source of reference potential VB;
   an amplifier of gain G2 responsive to the reference VB for applying a further reference G2×VB to the reference input connection of the analogue/digital converter;

a differential amplifier having a positive input connected to the reference VB and having a negative input connected on the one hand, to the circuit ground potential through a first resistor and, on the other hand, to a source electrode of a transistor having gate and drain electrodes respectively connected to an output of the differential amplifier and to the reference input of the digital/analogue converter for applying a still further reference different from G2×VB thereto, and a second resistor connected between the output of the processing circuit and ground potential of the circuit.

10. The processing circuit set forth in claim 9 wherein said gain of the processing circuit is independent of the reference VB.

11. The processing circuit set forth in claim 9 wherein said digital/analogue converter is controlled by a reference current at its reference input.

12. The processing circuit set forth in claim 9 wherein said reference VB is a bandgap voltage.

13. The processing circuit set forth in claim 9 wherein said analogue/digital converter, said digital/analogue converter, and said amplifier and said differential amplifier are fabricated on the same component in CMOS technology.

14. The processing circuit set forth in claim 9 wherein said first and second resistors and said transistor are fabricated on a common component in CMOS technology.

15. The processing circuit set forth in claim 9 wherein at least one of said first and second resistors is external to said digital processing circuit to permit adjustment of said gain of the digital processing circuit.

* * * * *